United States Patent [19]

Kamiya et al.

[11] Patent Number: 4,748,352

[45] Date of Patent: May 31, 1988

[54] POWER SOURCE RESET CIRCUIT FOR CONTACTLESS SWITCH

[75] Inventors: Fumio Kamiya, Nagaokakyo; Hisatoshi Nodera, Kusatsu; Kenji Ueda, Otsu; Keinosuke Imazu, Takatsuki; Hidehiro Tomioka, Kyoto, all of Japan

[73] Assignee: Omron Tateisi Electronics Co., Kyoto, Japan

[21] Appl. No.: 759,989

[22] Filed: Jul. 29, 1985

[30] Foreign Application Priority Data

Jul. 27, 1984 [JP] Japan ................................. 59-157917
Jul. 27, 1984 [JP] Japan ................................. 59-157918

[51] Int. Cl.$^4$ ......................... H03K 5/159; H03K 3/01
[52] U.S. Cl. .................................... 307/592; 307/490; 307/297
[58] Field of Search ............... 307/591, 592, 296 R, 307/490; 328/127, 128

[56] References Cited

U.S. PATENT DOCUMENTS 4,367,422  1/1983  Leslie .................................. 307/592
4,591,733  5/1986  Schröder ........................... 307/597

OTHER PUBLICATIONS

IBM Tech. Disclosure Bulletin, "Automatic Restart for Microprocessors", Blue et al., vol. 26, No. 10A, Mar. 84, pp. 5319 and 5320.
Article by A. D. Blumlein on Miller Integrator Source: "The Work of Alan Blumlein" British Kinematography Sound and Television, Vol. 50, No. 7, (Jul. 1968), p. 211. Article on Miller Integrator with an Integrating Amplifier.

Primary Examiner—Stanley D. Miller
Assistant Examiner—B. P. Davis
Attorney, Agent, or Firm—Wegner & Bretschneider

[57] ABSTRACT

Disclosed is a power source reset circuit which deactivates a contactless switch for a time interval determined by a delay means so as to prevent any erroneous output from the contactless switch while the output of a power source is unstable immediately after the power source is turned on. The reliability of the delay means is enhanced by the use of a Miller integration circuit which includes a current mirror circuit as a means for amplifying electric current. Furthermore, a switching device may be connected across the capacitor for integration so that the charge in the capacitor may be quickly discharge when the power is turned off, for the purpose of setting the power source reset circuit ready for the subsequent action when the power source is turned on thereafter. This invention is useful in applications where the power source for the contactless switch is frequently turned on and off.

7 Claims, 6 Drawing Sheets

POWER SOURCE RESET CIRCUIT FOR CONTACTLESS SWITCH

TECHNICAL FIELD

This invention relates to a power source reset circuit, for use in a contactless switch such as a photoelectric switch, a proximity switch and so on, which suspends the output from the contactless switch for a certain time interval for preventing any erroneous action of the contactless switch.

BACKGROUND OF THE INVENTION

A contactless switch tends to be unstable immediately after the power is turned on because of the instability in the circuit voltage. In particular, in a proximity switch of high frequency oscillation type, because a normal detection of an object is possible only after the oscillation circuit has started a normal oscillation, it is necessary to suspend the output of the power source for a certain time interval after the power is turned on.

Therefore, a contactless switch is generally equipped with a power source reset circuit which permits an output from the contactless switch only after a certain time interval from the time the power is turned on and the circuit voltage has reached a certain level. There is known such a reset circuit in which a capacitor for integration is charged by a very small current and the output of the output is delayed by the time interval until the charge voltage has reached a certain level. According to such a reset circuit, the delay time is determined by the capacitance of the capacitor for integration.

In a contactless switch which is required to be small in size, a large capacitor can not be used and a capacitor of, for instance, no more than tens of pF's is usable. Therefore, conventionally, a Miller circuit of a Darlington connection for a long delay time has been used for charging the capacitor.

FIGS. 7 and 8 are diagrams showing such power source reset circuits based on Miller circuits. For instance, according to the prior art shown in FIG. 7, a constant current source 1 with an output in the order of micro A's is used along with a pair of NPN transistors 2 and 3 in Darlington connection, and a capacitor for integration C is connected across the collector and the base of the transistor 2 so that the equivalent or effective capacitance of the capacitor for integration C would be the capacitance of the capacitor multiplied by the current gain (hfe) of the two transistors and the voltage across the capacitor C is detected by a comparator 4 so as to obtain a desired delay time. FIG. 8 likewise shows a Miller circuit formed with an NPN transistor 5 and a PNP transistor 6 in Darlington connection.

According to such a conventional power source reset circuit, the delay time may be extended because the equivalent capacitance of the capacitor C is equal to the capacitance times the hfe of the two Darlington transistors. However, because the current gain of a transistor varies depending on the temperature, the temperature fluctuation is also multiplied by the current gain. Therefore, the delay time tends to fluctuate a great deal according to the temperature, causing the problem that the reset time upon turning on power tends to be unstable.

There are control methods in which the power source applied to a contactless switch is frequently disconnected and, in such a case, if the power is turned on while the capacitor for integration retains some electric charge therein, the power source reset circuit may not be able to operate properly, sometimes starting its action and producing an erroneous output. According to conventional power source reset circuits, no provision was made to assure that the contactless switch may be activated properly upon turning on of the power and erroneous action was possible when they were used in applications where the power sources are frequently disconnected.

SUMMARY OF THE INVENTION

This invention was made in view of such problems of conventional power source reset circuits for a contactless switch and its primary object is to provide a power source reset circuit which is capable of stable power source reset action even if a small capacitor for integration is used, by eliminating the influences from temperature variations.

A second object of the present invention is to provide power source reset circuit for a contactless switch which can operated properly even when the power source is turned on and off very frequently.

According to the present invention the first object is accomplished by providing a power source reset circuit, for use in a contactless switch, for suspending the output from the contactless switch for a certain time interval after a power source is turned on, comprising: a capacitor for integration; a current source which starts charging the capacitor for integration when the voltage of the power source has reached a certain level; a Miller circuit which forms a current amplifier from a current mirror circuit with a pair of transistors having different emitter areas for charging the capacitor for integration with the current amplifier; a comparison means for comparing the voltage of the capacitor for integration with a certain level and for terminating the resetting when the charge voltage has reached the certain level.

According to this invention which is thus characterized, because a current mirror circuit is used in a Miller integration circuit and current amplification is achieved by using different emitter areas for the current mirror circuit, the variations in current gain due to temperature changes are minimized. Therefore, it is possible to provide a power source reset circuit having an always stable delay time upon turning on power even when a small capacitor is used, by using a Miller integration circuit.

The second object of this invention is accomplished by providing an above-described power source reset circuit which further includes a switching means connected across the capacitor for integration.

According to this invention which is thus characterized, because the capacitor for integration of the power source reset circuit is discharged every time the power source is disconnected, the power source reset circuit is always ready for the next time the power is turned on even in the applications of a contactless switch where the power source is connected and disconnected in a short span of time. Therefore, a reliable power source reset action is always achieved even when the power source is frequently disconnected.

BRIEF DESCRIPTION OF THE DRAWINGS

The present invention will now be shown and described in the following in terms of concrete embodiments thereof with reference to the appended drawings, in which.

DESCRIPTION OF PREFERRED EMBODIMENT(S)

Figure 1:
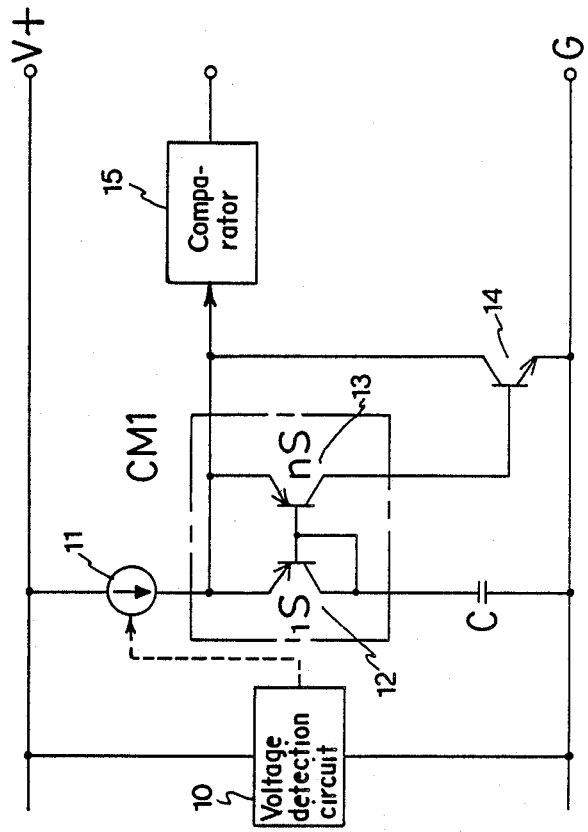
FIG. 1 is a circuit diagram showing an embodiment of the power source reset circuit for a contactless switch according to this invention.

FIG. 1 is a circuit diagram of an embodiment of a power source reset circuit according to this invention. In the drawing, a voltage detection circuit 10 is provided across a power source. This voltage detection circuit 10 is a detector which detects whether the power source voltage has exceeded a certain operable value or not and supplies an output to a constant current source 11 when the power source voltage has exceeded the value. The constant current source 11 supplies a constant current of, for instance, several micro A's to a transistor 12 when the output is given from the voltage detection circuit 10.

The transistor 12 forms a current mirror circuit CM1 along with a transistor 13 and a capacitor for integration C is connected across the collector of the transistor 12 and the ground. The transistors 12 and 13 are formed on an IC chip in such a manner that the emitter area of the transistor 13 is n-times greater than the emitter area of the transistor 12, or as shown as 1S:nS in the drawing. The collector of the other transistor 13 of the current mirror circuit CM1 is connected to the base of an NPN transistor 14.

The collector of the transistor 14 is connected in common with the emitters of the two transistors 12 and 13 of the current mirror circuit CM1 and the constant current source 11, and is also connected to a comparator 15. The comparator 15 produces an output for enabling a contactless switch when the voltage of this power source reset circuit has reached a certain value.

Figure 2:
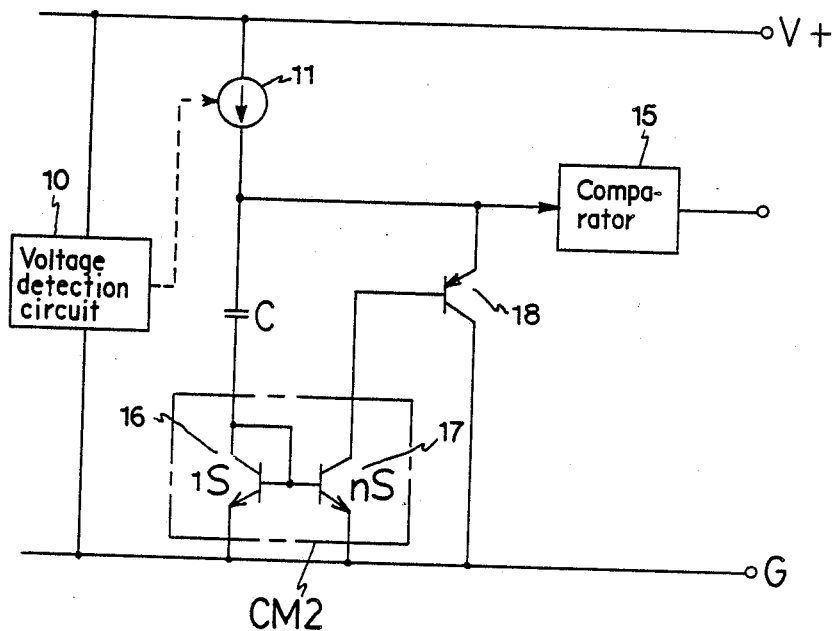
FIG. 2 is a circuit diagram showing another embodiment of the power source reset circuit for a contactless switch according to this invention.

FIG. 2 is a circuit diagram showing another embodiment of the power source reset circuit according to this invention. In this embodiment, those parts which correspond to the parts of the embodiment shown in FIG. 1 are denoted with like numerals. In this embodiment, a pair of NPN transistors 16 and 17 are used for a current mirror circuit CM2 and a PNP transistor 18 is used for amplifying the mirror current. The emitter area of the transistor 17 of the current mirror circuit CM2 is n-times greater than that of the transistor 16 and the collector of the transistor 17 is connected to the base of the transistor 18, in the same way as the first embodiment.

Figure 3:
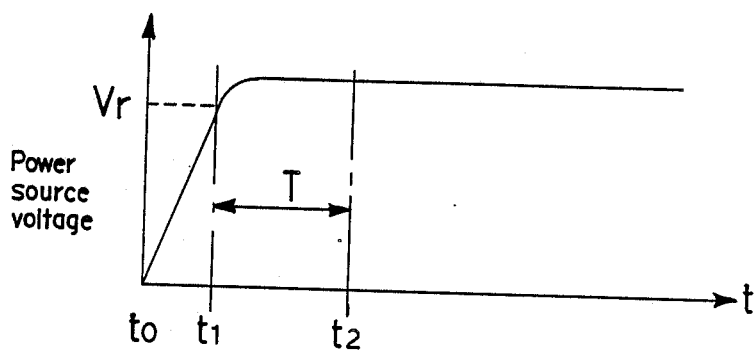
FIG. 3 is a graph showing the changes in the power source voltage after the power is turned on with respect to the embodiments shown in FIGS. 1 and 2.

Now the action of the first embodiment is described as follows. FIG. 3 is a graph showing the changes in the power source voltage after the power is turned on. In this graph, the power is turned on at time t0 and the voltage rises as shown in the graph. When the voltage reaches a certain level Vr at time t1, the voltage detection circuit 10 sends its output to the constant current source 11. Accordingly, a constant current flows out from the constant current source 11 and is supplied to the current mirror circuit CM1 and the transistor 14.

The collector current of the transistor 13 is supplied to the base of the NPN transistor 14 after being amplified to n-times of the collector current of the transistor 12 according to the emitter area ratio, by the current mirror circuit CM1. If the current gain of the transistor 14 is hfe, then it amounts to performing Miller integration with an amplifier having a gain of n·hfe and the it is equivalent to increasing the capacitance of the capacitance C. At time t2, the collector voltage of the transistor 14 rises over the certain value and an output is produced from the comparator 15 to activate the contactless switch.

Here, the current gain of the transistor 14 varies according to the changes in temperature as in the prior art, but the emitter areas of the current mirror circuit formed on an IC chip never depend on temperature. Therefore, as opposed to the prior art, it is possible to drastically reduce the fluctuations in the current gain and to obtain a stable reset time T.

Similarly, according to the embodiment shown in FIG. 2, electric current is supplied from the constant current source 11 and the current flowing into the capacitor for integration C is current amplified by the current mirror circuit CM2 and the transistor 18. Thus, with the equivalent capacitor of the capacitor C increased by the Miller integration, the voltage across the capacitor for integration C gradually increases. Thus, the comparator 15 can produce a power source reset time T.

Figure 4:
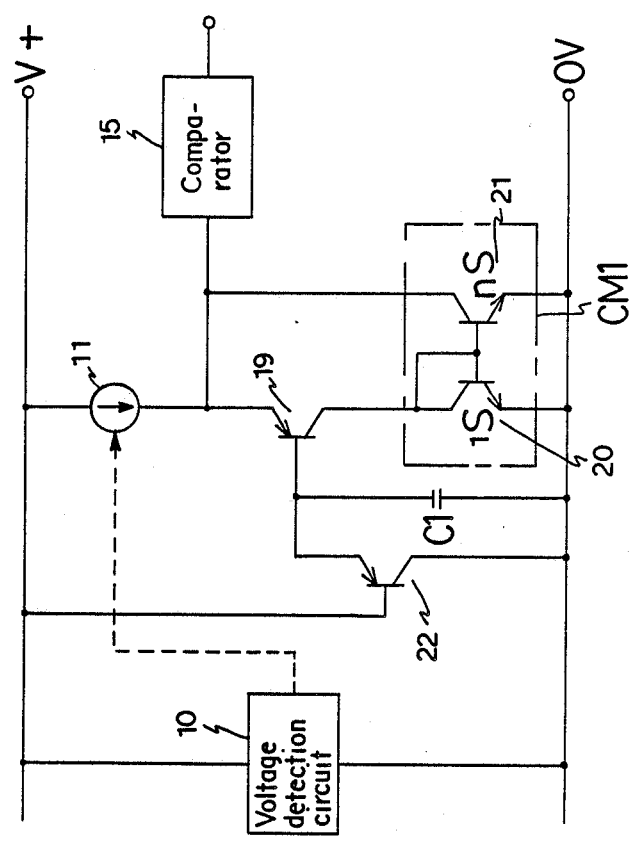
FIG. 4 is a circuit diagram showing yet another embodiment of the power source reset circuit for a contactless switch according to this invention.

FIG. 4 is a circuit diagram of yet another embodiment of the power source reset circuit according to this invention. In this embodiment, those parts which correspond to the parts of the embodiment shown in FIG. 1 are denoted with like numerals.

In FIG. 4, a voltage detection circuit 10 is provided across a power source. This voltage detection circuit 10 is a detector which detects whether the power source voltage has exceeded a certain operable value or not and supplies an output to a constant current source 11 when the power source voltage has exceeded the value. The constant current source 11 supplies a constant current of, for instance, several micro A's to the emitter of a transistor 19 when the output is given from the voltage detection circuit 10.

The collector of the transistor 19 is connected to a current mirror circuit CM1 and the base of the transistor 19 is grounded by way of a capacitor for integration C1. The capacitor for integration C1 is connected across the emitter and the collector of a transistor 22 for discharge and the base of the transistor 22 is connected to a power source. The transistors 20 and 21 are formed on an IC chip in such a manner that the emitter area of the transistor 21 is n-times greater than the emitter area of the transistor 20, or as shown as 1S : nS in the drawing.

The collector of the transistor 21 is connected in common with the emitter of the transistor 19 and the constant current source 11, and is also connected to a comparator 15. The comparator 15 produces an output for enabling a contactless switch when the voltage of this power source reset circuit has reached a certain value.

Figure 5:
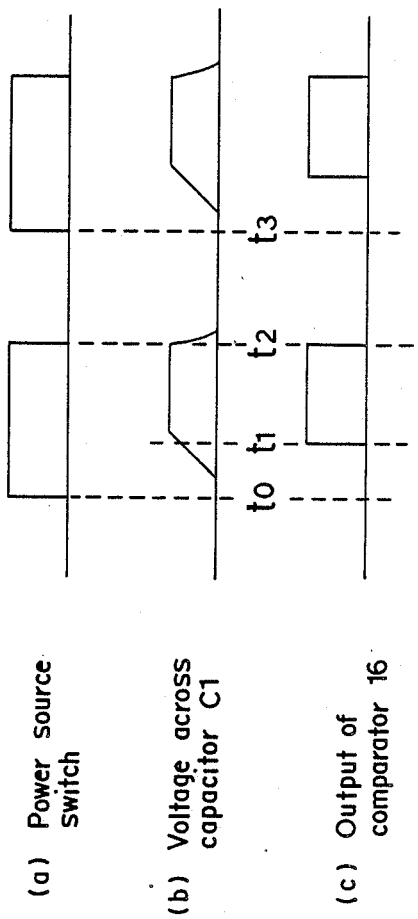
FIG. 5 is a waveform diagram showing the action of the embodiment, shown in FIG. 4, of the power source reset circuit according to this invention.

Now the action of the third embodiment is described in the following. FIG. 5 is a graph showing the changes in the power source voltage after the power is turned on. In this graph, the power is turned on at time t0 and the voltage rises as shown in the FIG. 5(a). When the voltage reaches a certain level at time t1, the voltage detection circuit 10 sends its output to the constant current source 11. Accordingly, a constant current flows out from the constant current source 11 and is supplied to transistor 19, the transistor 21 of the current mirror circuit CM1 and the capacitor for integration C1.

Because the collector current of the transistor 19 is hfe-times greater than the current flowing into the capacitor for integration C1 and the ratio of the emitter areas of the transistor 20 and 21 is 1S:nS, the collector current is amplified by the factor of n. Therefore, the current of $[1+(n+1)\times hfe]$-times of the current flowing into the capacitor C1 flows into the transistors 19 and 21.

At this time, the base of the transistor 22 is connected to the power source or inversely biased and the transistor 22 is in OFF state. Therefore, as shown in FIG. 5(b), the voltage across the capacitor C1 rises gradually and the collector voltage of the transistor 21 also rises accordingly. When the voltage reaches a certain level at time t1, the comparator 15 produces an output as shown in FIG. 5(c) and enables the action of the contactless switch thereafter.

And when the power source switch is turned off at time t2, the power source voltage decreases and the base voltage of the transistor 22 decreases. As a result, the potential of the emitter of the transistor 22 decreases below the base potential due to the electric charge of the capacitor for integration C1 and the transistor 22 turns on, whereby the capacitor for integration C1 is rapidly discharged as shown in FIG. 5(b). Therefore, even when the power source switch is turned on again at time t3, it becomes possible to activate the power source reset circuit by the same action without fail.

Figure 6:
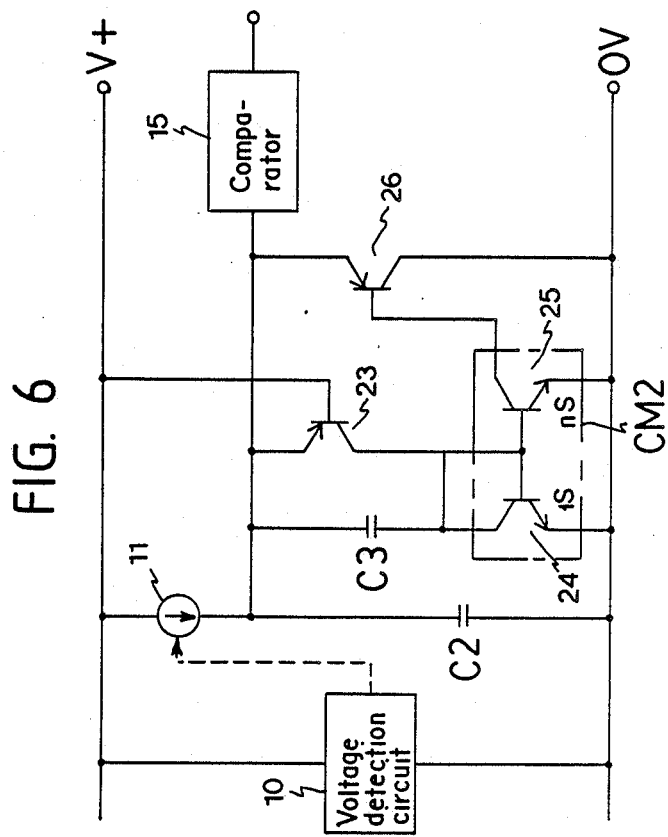
FIG. 6 is a circuit diagram showing yet another embodiment of the power source reset circuit for a contactless switch according to this invention.
Figure 7:
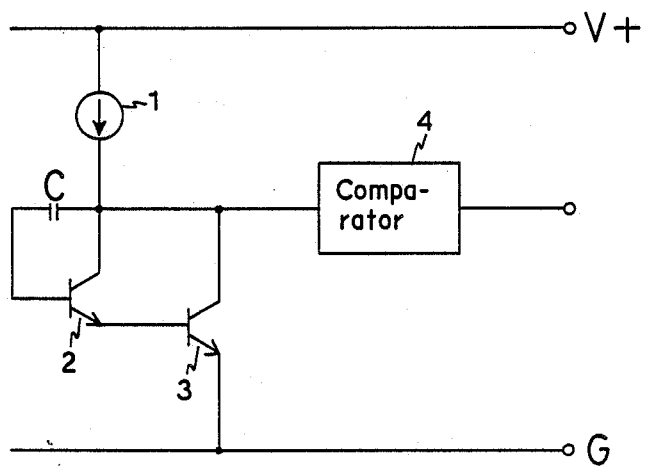
FIGS. 7 and 8 are circuit diagrams showing examples of conventional power source reset circuits.
Figure 8:
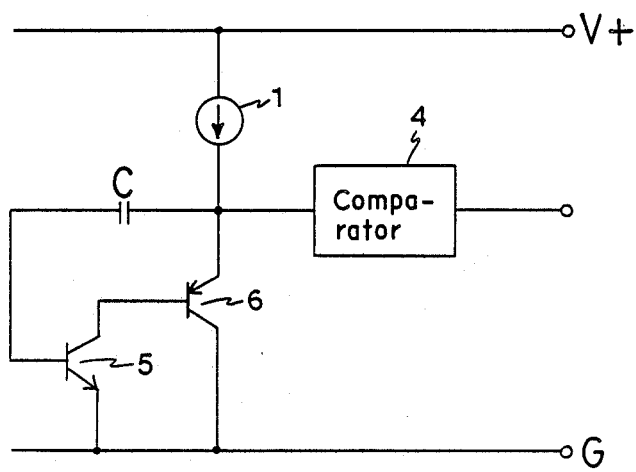

FIG. 6 is a circuit diagram showing yet another embodiment of the power source reset circuit according to this invention. In this embodiment also, those parts which correspond to the parts of the embodiment shown in FIG. 1 are denoted with like numerals.

In this embodiment, a secondary capacitor C2 and a capacitor for integration C3 are connected to the constant current source 11, and the capacitor for integration C3 is connected across the emitter and the collector of a transistor 23 for discharge while the base of the transistor 23 is connected to the power source. The other end of the capacitor for integration C3 is connected to a current mirror circuit CM2 consisting of transistors 24 and 25 and this current mirror circuit CM2 accomplishes current amplification by virtue of the difference in the emitter areas. The collector of the transistor 25 is connected to the base of a transistor 26 for current amplification. The collector of the transistor 26 is connected in common with the constant current source 11 along with the capacitor for integration C3, and the emitter of the transistor 26 is connected to a comparator 15.

Similarly, according to this embodiment, when the power source is turned on, a detection signal is supplied from the voltage detection circuit 10 to the constant current source 11 and electric current is supplied from the constant current source 11 to the capacitors C2 and C3. The current flowing into the capacitors C3 is current amplified by the current mirror circuit CM2 and the transistor 26, and the the reset action upon turning on of the power source is suspended by the output of the comparator 15 until the voltage across the capacitor C3 reaches a certain value. And, when the power source is turned off, the charge of the capacitor C2 is discharged through the emitter and the base of the transistor 23 and the transistor 23 turns into conductive state.

Therefore, the capacitor for integration C3 is short-circuited and discharges rapidly. Thus, when the power source is turned on subsequently, it is possible to reactivate the power source reset circuit.

Although the present invention has been shown and described with reference to the preferred embodiment thereof, and in terms of the illustrative drawings, it should not be considered as limited thereby. Various possible modifications and alterations could be conceived of by one skilled in the art to any particular embodiment, without departing from the scope of the invention. For instance, in the above-described embodiments, a current mirror circuit and a transistor are connected in series, but it is also possible to use two current mirror circuits for current amplification. Therefore it is desired that the scope of the present invention should be defined not by any of the perhaps purely fortuitous details of the shown preferred embodiment, or of the drawings, but solely by the scope of the appended claims, which follow.

What we claim is:

1. A power source reset circuit for use in a contactless switch, comprising:
    a capacitor for integration;
    a current source which starts charging the capacitor for integration when a voltage of the power source has reached a first certain level;
    a Miller circuit which forms a current amplifier from a current mirror circuit with a pair of transistors having different emitter areas and wherein the capacitor for integration is connected across the Miller integration circuit for charging the capacitor for integration with the current amplifier, and wherein the Miller circuit suspends an output from the contactless switch for a certain time interval after the power source is turned on;
    a comparison means for comparing a voltage of the capacitor for integration with a second certain level and for producing an output when the charge voltage has reached the certain level; and
    a switch means for discharging the capacitor for integration each time the power source is disconnected.

2. A power source reset circuit for use in a contactless switch, as defined in claim 1, wherein the power source reset circuit further comprises a voltage detection signal which activates the current source when the output voltage of the power source has exceeded a certain value.

3. A power source reset circuit, for use in a contactless switch, as defined in claim 2, wherein the Miller integration circuit comprises a serial connection of the current mirror circuit and a transistor for current amplification, the current mirror circuit being formed by a pair of transistors having different emitter areas.

4. A power source reset circuit, for use in a contactless switch, as defined in claim 3, wherein the the power source reset circuit further comprises a switching device connected across the capacitor for integration so as to become non-conductive state when the power is turned on and to become conductive when the power is turned off.

5. A power source reset circuit, for use in a contactless switch, as defined in claim 4, wherein the switching device is a transistor.

6. A power source reset circuit, for use in a contactless switch, as defined in claim 5, wherein a biasing current for turning on the transistor serving as the switching device is provided from the capacitor for integration.

7. A power source reset circuit, for use in a contactless switch, as defined in claim 5, wherein a biasing current for turning on the the switching device consisting of a transistor is provided from a capacitor which is separate from the capacitor for integration.

* * * * *